(12) United States Patent
Wang et al.

(10) Patent No.: US 10,505,050 B2
(45) Date of Patent: Dec. 10, 2019

(54) THIN FILM TRANSISTOR, FABRICATING METHOD THEREOF, ARRAY SUBSTRATE, AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/037,481

(22) Filed: Jul. 17, 2018

(65) Prior Publication Data
US 2019/0131457 A1 May 2, 2019

(30) Foreign Application Priority Data
Nov. 2, 2017 (CN) .......................... 2017 1 1062767

(51) Int. Cl.
| H01L 29/786 | (2006.01) |
| H01L 27/12 | (2006.01) |
| H01L 29/417 | (2006.01) |
| H01L 29/66 | (2006.01) |

(52) U.S. Cl.
CPC ...... *H01L 29/7869* (2013.01); *H01L 27/1225* (2013.01); *H01L 27/1262* (2013.01); *H01L 27/1288* (2013.01); *H01L 29/41733* (2013.01); *H01L 29/66742* (2013.01); *H01L 29/78621* (2013.01)

(58) Field of Classification Search
CPC combination set(s) only.
See application file for complete search history.

(56) References Cited

U.S. PATENT DOCUMENTS

| 2006/0043375 | A1* | 3/2006 | Takasugi | G09G 3/3233 257/72 |
| 2017/0256421 | A1* | 9/2017 | Liu | H01L 21/02244 |
| 2017/0294516 | A1* | 10/2017 | Zhang | H01L 29/66015 |
| 2017/0373181 | A1* | 12/2017 | Wang | H01L 21/34 |
| 2018/0006142 | A1* | 1/2018 | Yan | H01L 29/66969 |
| 2018/0090517 | A1* | 3/2018 | Park | H01L 27/1248 |
| 2018/0277711 | A1* | 9/2018 | Fan | H01L 33/0041 |
| 2018/0337199 | A1* | 11/2018 | Hu | H01L 27/1225 |
| 2018/0337358 | A1* | 11/2018 | Xie | H01L 51/0566 |
| 2019/0013412 | A1* | 1/2019 | Xie | H01L 29/78648 |

* cited by examiner

*Primary Examiner* — Mamadou L Diallo
(74) *Attorney, Agent, or Firm* — Foley & Lardner LLP; James F. Ewing; Paul M. H. Pua

(57) ABSTRACT

The present disclosure relates to thin film transistor, fabricating method thereof, array substrate, and display device. A thin film transistor is provided that comprises: a substrate; an active layer, a first source electrode, and a first drain electrode disposed on a side of the substrate, the first source and drain electrodes being coupled to the active layer; and a first insulating layer and a gate disposed on a side of the active layer which is facing away from the substrate, the first insulating layer positioned between the active layer and the gate, wherein, the gate has a substantially same material as the first source and drain electrodes, and a main-body portion of the gate has a substantially same thickness as main-body portions of the first source and drain electrodes.

15 Claims, 6 Drawing Sheets

THIN FILM TRANSISTOR, FABRICATING METHOD THEREOF, ARRAY SUBSTRATE, AND DISPLAY DEVICE

CROSS-REFERENCE TO RELATED APPLICATIONS

The present application claims priority to Chinese Patent Application No. 201711062767.7 filed on Nov. 2, 2017, which is hereby incorporated in its entirety by reference.

TECHNICAL FIELD

The present disclosure relates to the field of display technologies, and in particular, to a thin film transistor (TFT), a method of fabricating the same, an array substrate, and a display device.

BACKGROUND

Oxide semiconductor thin film transistor typified by IGZO TFT has been rapidly developed. In order to produce a higher resolution display panel, it is necessary to solve the problem of excessive parasitic capacitance of the TFT. Generally, a top-gate self-aligned TFT structure is used in the prior art to reduce the parasitic capacitance of the TFT. However, the display panel with top gate TFT structure has the following problems to be solved. In an aspect, [PPMH1] the electrical resistance between the active layer and the source and drain electrodes can be reduced. In another aspect, since the oxide semiconductor itself is sensitive to light, the electrical characteristics of the channel region will be changed under illumination. In a further aspect, due to the presence of the LDD region, the shielding layer are not able to completely and effectively isolate the influence of light on the active layer, so that the TFT is prone to threshold (Vth) drifting, and the TFT may still have such a problem of poor illumination stability.

SUMMARY

According to an aspect of the present disclosure, there is provided a thin film transistor comprising: a substrate; an active layer, a first source electrode, and a first drain electrode disposed on a side of the substrate, the first source and drain electrodes being coupled to the active layer; and a first insulating layer and a gate disposed on a side of the active layer which is facing away from the substrate, the first insulating layer positioned between the active layer and the gate, wherein, the gate has a substantially same material as the first source and drain electrodes, and a main-body portion of the gate has a substantially same thickness as main-body portions of the first source and drain electrodes.

In some embodiments, an orthographic projection of the first insulating layer on the substrate overlaps with an orthographic projection of the active layer on the substrate in entirety.

In some embodiments, an orthographic projection of the active layer on the substrate at least partially overlaps with an orthographic projection of the gate on the substrate, and the orthographic projection of the gate on the substrate does not exceed the orthographic projection of the active layer on the substrate.

In some embodiments, the active layer comprises metal oxide semiconductor material.

In some embodiments, the substrate comprises: a base layer, a shielding layer, and a buffer layer; wherein the shielding layer is disposed between the base layer and the buffer layer; and wherein the buffer layer is closer, than the base layer, to the active layer.

In some embodiments, the thin film transistor further comprises: a second insulating layer disposed on the side of the substrate and covering at least the first source electrode, the first drain electrode and the gate; and conductive members coupled to the first source and drain electrodes respectively through the second insulating layer.

In some embodiments, the first source and drain electrodes each adjoin a respective side surface of the active layer.

In some embodiments, the gate and the first source and drain electrodes are formed from a same metal material layer.

According to an aspect of the present disclosure, there is provided a method of fabricating a thin film transistor, comprising: providing a substrate; forming an active layer and a first insulating layer, which are staked, on a side of the substrate, the active layer positioned between the substrate and the first insulating layer; forming a gate on a side of the first insulating layer which is facing away from the substrate, and a first source electrode and a first drain electrode on the side of the substrate, the first source electrode and the first a drain electrode coupled to the active layer, wherein the gate has a substantially same material as the first source and drain electrodes, and a main-body portion of the gate has a substantially same thickness as main-body portions of the first source and drain electrodes.

In some embodiments, forming the active layer and the first insulating layer, which are stacked, on a side of the substrate comprises: forming an active material layer on the side of the substrate; forming a first insulating material layer on a side of the active material layer which is facing away from the substrate; patterning the active material layer and the first insulating material layer to form the active layer and the first insulating layer which are stacked.

In some embodiments, forming the gate and the first source and drain electrodes comprises: forming a metal material layer on the side of the substrate, the metal material layer covering the first insulating layer and the active layer which are stacked; patterning the metal material layer to form the gate, the first source and drain electrodes.

In some embodiments, patterning the metal material layer comprises: forming a patterned mask on a side of the metal material layer which is facing away from the substrate; and etching the metal material layer with use of the mask to form the gate and the first source and drain electrodes, wherein the etching is configured to continue for a period of time after ends of the first source and drain electrodes which are facing away from the active layer are etched, so that the gate, the first source and drain electrodes are completely separated.

In some embodiments, providing the substrate comprises: providing a base layer; forming a shielding layer on a side of the base layer; and forming a buffer layer on the side of the base layer, the buffer layer covering the shielding layer, wherein the buffer layer is closer, than the base layer, to the active layer.

In some embodiments, the method further comprises: forming a second insulating layer on the side of the substrate, the second insulating layer covering the first source electrode, the first drain electrode and the gate; and forming conductive members coupled to the first source and drain electrodes, respectively, through the second insulating layer.

In some embodiments, the first source and drain electrodes each adjoin a respective side surface of the active layer.

In some embodiments, the metal material layer has a thickness substantially same as the gate, and the thickness is configured such that the metal material layer covers side surfaces of the active layer and the first insulating layer.

According to an aspect of the present disclosure, there is provided a display device comprising the thin film transistor of any of the embodiments of the present disclosure.

DRAWINGS

The accompanying drawings, which are incorporated as a part of the specification, illustrate the embodiments of the present disclosure, and along with the Description are used to illustrate and explain the principle of the present disclosure.

The present disclosure can be more clearly understood from the following detailed description with reference to the drawing in which.

Figure 1:
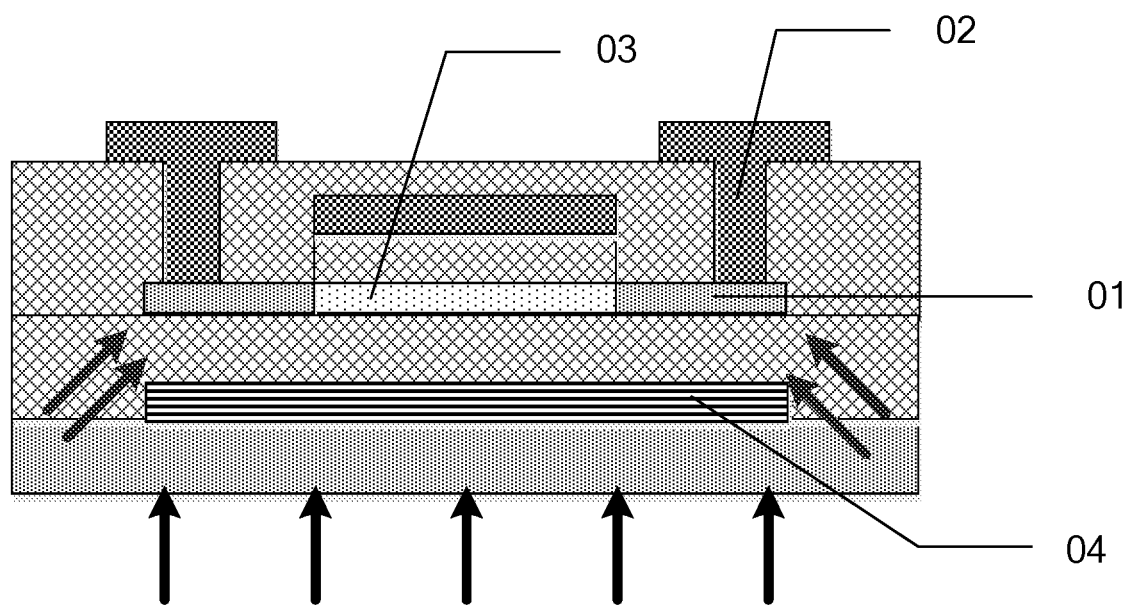
FIG. 1 illustrates a schematic cross-sectional view of a thin film transistor of the prior art.

Note that, in the embodiments described below, sometimes the same reference numerals may be used to refer to the same parts or the parts having the same functions, and the repeated description thereof will be omitted. In some cases, like reference numerals and symbols may be used to indicate like items, and thus, once an item is defined in a drawing, it will not be further discussed in the subsequent figures.

It is to be noted that the positions, sizes, ranges, and the like of the respective structures shown in the drawings and the like are not intended to represent actual or precise positions, sizes, ranges, and the like. Therefore, the present disclosure shall not be limited to the positions, sizes, ranges, and the like disclosed in the drawings, embodiments and the like.

DETAILED DESCRIPTION OF EMBODIMENTS

For better understanding of the above-described objects, features and advantages of the present disclosure, detailed descriptions will be given below in connection with the drawings and the embodiments.

FIG. 1 is a schematic cross-sectional view of a thin film transistor of the prior art. Referring to FIG. 1, in order to reduce the contact resistance between the active layer of the oxide semiconductor and the source/drain electrodes, generally an LDD (Lightly-Doped Drain) region 01 is formed in the TFT in the prior art, for example, by converting a region of the active layer 03, with which the source/drain electrodes 02 are contacted, into conductor using a gas plasma treatment process with gas such as Ar, He or the like. However, the fabrication of the LDD region 01 has the problems of complicated process, reduced device mobility, and poor stability. On the other hand, since the oxide semiconductor itself is sensitive to light, and the electrical characteristics of the channel region will be changed under illumination. In order to improve the illumination stability, usually a shielding layer 04 is provided in the prior art to shield the light. However, due to the presence of the LDD regions 01, the shielding layer 04 may be not able to completely or effectively isolate the light and prevent the influence of light on the active layer 03. Thus the TFT is prone to Vth drifting, and there may still be a problem of poor light stability.

For addressing one or more of the above and other problems recognized by the inventors of the present application, the present disclosure is provided.

Figure 2:
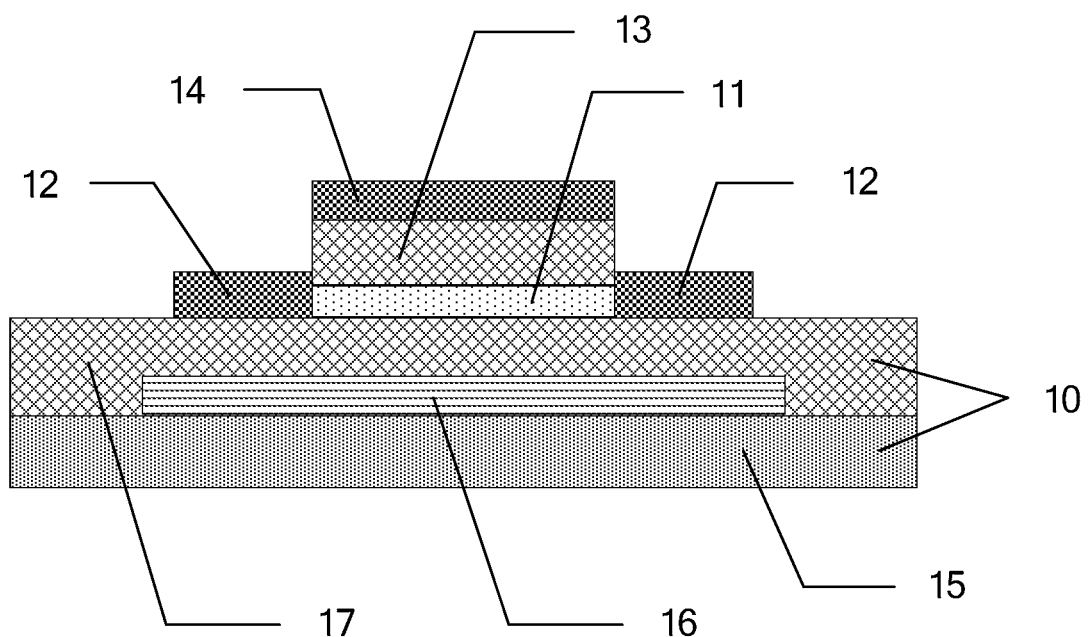
FIG. 2 illustrates a schematic cross-sectional view of another thin film transistor according to some embodiments of the present disclosure.

In some embodiments of the present disclosure, a thin film transistor is provided. FIG. 2 shows a schematic sectional view of the structure of the thin film transistor. As shown in FIG. 2, the thin film transistor may include a substrate 10, and an active layer 11 and a first source electrode and a first drain electrode 12 which are disposed on the substrate 10. The first source and drain electrodes 12 are coupled to the active layer 11. The thin film transistor may further include a first insulating layer 13 and a gate 14 laminated on the active layer 11. The first insulating layer 13 is disposed between the active layer 11 and the gate 14. In some embodiments, the gate 14 has substantially the same material as the first source and drain electrodes 12, and the thickness of at least the main-body portion of the gate 14 and the thickness of at least the main-body portions of the first source and drain electrodes 12 are substantially the same. In other embodiments, the gate 14 has substantially the same thickness as the first source and drain electrodes 12. It should be understood that the term "main-body portion" used herein is termed relatively to an edge portion.

The active layer 11 includes a channel region. The material of the active layer 11 may include semiconductor material such as amorphous silicon, low temperature polysilicon, or an oxide semiconductor. In some implementations, the active layer 11 may employ a metal oxide semiconductor material such as indium-gallium-zinc oxide (IGZO). Compared with the conventional silicon-based thin film transistor, the metal oxide thin film transistor such as IGZO TFT has the advantages of high mobility, good uniformity, and simple preparation process.

The first source and drain electrodes 12 may be made of various metal materials such as, but not limited to, Mo, Al, Ti, Au, Cu, Hf, or Ta. In a practical application, the device may further include a conductive member coupled to the first source and drain electrodes 12, for example, via or wiring.

The first insulating layer 13 is also usually referred to as a gate insulating layer, and the material thereof may include silicon oxide, silicon nitride, silicon oxynitride, or other suitable material.

The gate 14 may include a material such as Mo, Al, Ti, Au, Cu, Hf, or Ta. As mentioned above, in some embodiments of the present disclosure, the material of the gate 14 is the same as that of the first source and drain electrodes 12. The thickness of at least the main-body portion of the gate 14 may be substantially the same as the thicknesses of at least the main-body portions of the first source and drain electrodes 12.

In some embodiments, the gate 14 and the first source and drain electrodes 12 may also have the same stacked structure.

Since the thickness and material of the gate 14 and the first source and drain electrodes 12 are substantially the same, in the fabrication of the thin film transistor, the gate 14 and the first source and drain electrodes 12 can be synchronously formed from a same layer, thereby the fabrication process can be simplified, the yield can be increased, and the costs can be reduced.

Here, in some embodiments, the thickness of the first source and drain electrodes 12 may be set to be higher than the thickness of the active layer 11. In this way, more sufficient shielding of the side light can be achieved, and the contact area between the electrodes and the active layer can be ensured.

In the thin film transistor structure of prior art, as in the structure shown in FIG. 1, the resistance between the source and drain electrodes 02 and the channel region 03 can be expressed as: Rp=2Rc+2Rldd; wherein Rp is the total parasitic resistance between the source and drain electrodes 02 and channel region 03, Rc is the contact resistance between one LDD region 01 at a side and source/drain electrode 02, and Rldd is the resistance of one LDD region 01.

In the embodiments, the first source and drain electrodes 12 are directly coupled to the active layer 11, and there is no LDD region. Thus, the resistance between the source and drain electrodes and the active layer 11 does not include the resistance of the LDD regions themselves, leaving only the contact resistance between the first source and drain electrodes 12 and the active layer 11. And, this contact resistance is equivalent to or comparable to the contact resistance of the source and drain electrodes 02 and the LDD region 01 in the prior art. Thus, according to the thin film transistor of the embodiments, the resistance between the source and drain electrodes and the active layer can be reduced.

In addition, in the prior art, due to the presence of the LDD region 01, the shielding layer 04 is not able to completely and effectively prevent the influence of the side light (as indicated by the arrow in FIG. 1) on the active layer 03. Whereas, in the present embodiment, due to the configuration of the first source and drain electrodes 12, the TFT active layer 11 can effectively blocked from the light from the side (i.e., side light), and the Vth drifting due to the illumination by the side light can be reduced.

In addition, according to some embodiments of the present disclosure, since the materials and the thicknesses of the gate and the first source and drain electrodes are the same, the gate and the first source and drain electrodes can be formed in synchronization, thereby the fabrication process can be simplified, the yield can be increased, and the costs can be reduced.

In an implementation of the above embodiments, the orthographic projection of the first insulating layer 13 on the substrate 10 and the orthographic projection of the active layer 11 on the substrate 10 may substantially overlap, thus, the first insulating layer 13 and the active layer can be formed synchronously, e.g., in the same process step(s). Therefore, the fabrication process can be further simplified.

In some embodiments, the orthographic projection of the active layer on the substrate may at least partially overlap the orthographic projection of the gate on the substrate, and the orthographic projection of the gate on the substrate may be not exceeding the orthographic projection of the active layer on the substrate.

For example, in some practical applications, the orthographic projection of the gate 14 on the substrate 10 may overlap the orthographic projection of the active layer 11 on the substrate 10 in its entirety. As such, the gate and active layer can be fabricated using reduced dimensions, such as the minimum size achievable by the fabrication equipment or allowed by design rules. For example, the reduced or minimum size can be used for the gate length of the gate between the source and drain electrodes, and the corresponding dimension of the corresponding active layer below the gate. Thereby, the area of a unit device (for example, a pixel unit) can be reduced, and the resolution can be improved.

However, the present disclosure shall not be limited thereto. In some cases, for example, the orthographic projection of the gate 14 on the substrate 10 may be less than the orthographic projection of the active layer 11 on the substrate 10 due to alignment or etching error (i.e., may be within the orthographic projection of the active layer 11 on the substrate). In this case, there is a possibility that the resistance is increased and the turn-on voltage is increased. In such a case, a "conductorizing" process as described above can be used to convert the portion of the active layer that is not covered by the gate into conductor, thereby improving the conductivity of that portion and reducing the contact resistance of that portion with the source electrode/drain electrode.

In some embodiments, the first source and drain electrodes each adjoin a respective side of the active layer, as shown in FIG. 2. Additionally, as will be further explained below, the gate and the first source and drain electrodes can be formed from a same layer of metal material.

Figure 5:
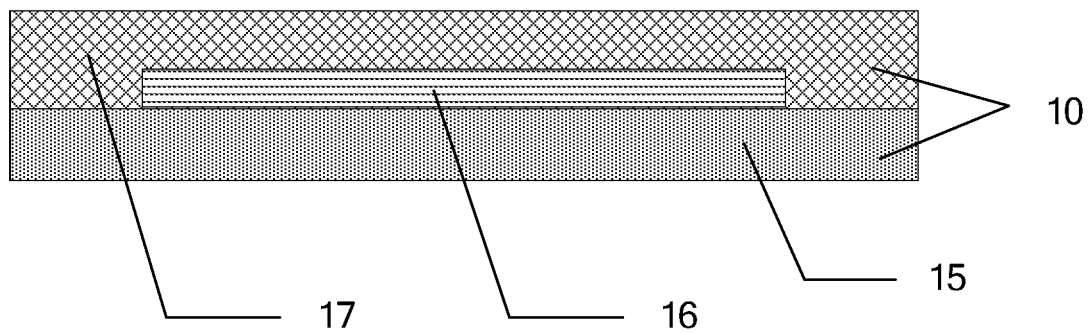
FIG. 5 illustrates a cross-sectional structural diagram of a substrate according to some embodiments of the present disclosure.

In some embodiments, as shown in FIGS. 2 and 5, the substrate 10 may further include: a base layer 15 and a shielding layer 16 disposed on the base layer 15; and a buffer layer 17 disposed on the base layer 15 and the shielding layer 16. As shown in the figure, the shielding layer 16 is disposed between the base layer 15 and the buffer layer 17.

In some embodiments, the substrate layer 15 can be a glass substrate or other substrate such as flexible substrate. The material of the shielding layer 16 may be MoNb metal and a thin layer of AlNd metal, etc., and is mainly used to shield external light for the TFT device. In combination with the first source and drain electrodes 12 which are in direct contact with the active layer 11 in the embodiments, effective shielding of the side light and the light irradiated from the lower portion can be achieved. Thereby, the illumination stability of the TFT can be enhanced, and the Vth drifting can be reduced. The material of the buffer layer 17 may be silicon oxide, silicon nitride or silicon oxynitride or the like.

Figure 3:
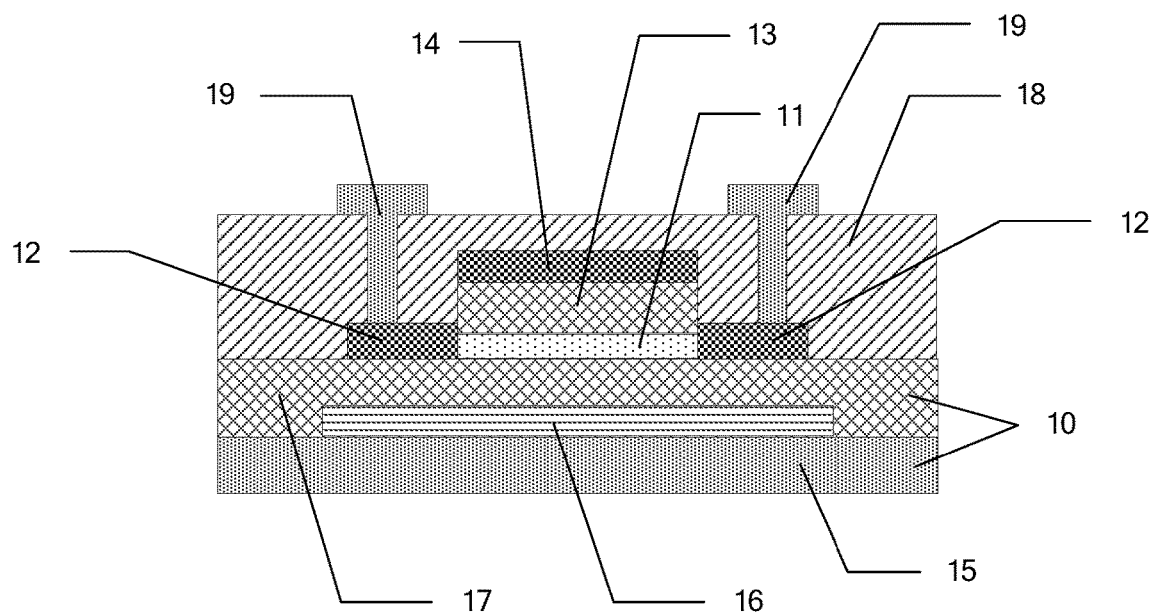
FIG. 3 illustrates a cross-sectional view of another thin film transistor according to some embodiments of the present disclosure.

Referring to FIG. 3, in some embodiments, the thin film transistor may further include: a second insulating layer 18 disposed on the substrate 10, the first source and drain electrodes 12, and the gate 14; and a conductive member 19. The conductive members 19 are coupled to the first source electrode 12 and the first drain electrode 12, respectively, through the second insulating layer.

In some embodiments, as shown in FIG. 3, the conductive member 19 may include a portion (e.g., a wiring) disposed on the second insulating layer 18, and a via disposed in the second insulating layer 18. The portions (for example, wirings) provided on the second insulating layer 18 are respectively coupled to the first source and drain electrodes 12 through corresponding vias.

The portion of the conductive member 19 disposed on the second insulating layer 18 may be a metal wiring such as a source line or a drain line. The material thereof may be the same as the material of the first source/drain metal layer 12. The second insulating layer 18 may be an insulating layer such as an interlayer dielectric (ILD) layer. In some embodiments, the material of the insulating layer 18 may be the same as or different from the material of the first insulating layer 13.

Figure 4:
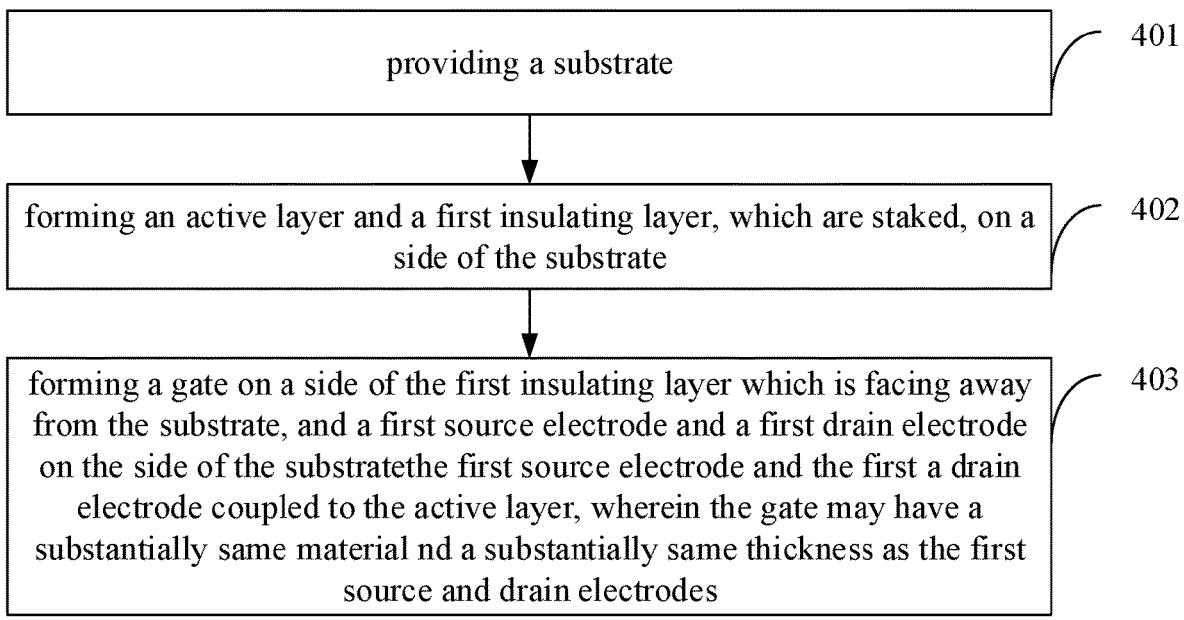
FIG. 4 illustrates a flow chart showing steps of a method for fabricating a thin film transistor according to some embodiments of the present disclosure.

FIG. 4 illustrates a flow chart of a method of fabricating a thin film transistor in accordance with further embodiments of the present disclosure. As shown in FIG. 4, the fabrication method may include, but is not limited to, the following steps.

Step 401: providing an substrate 10. FIG. 5 is a schematic cross-sectional view of an exemplary substrate according to the embodiments of the present disclosure. As shown in FIG. 5, the substrate 10 may further include: a base layer 15 and a shielding layer 16 disposed on the base layer 15; and a buffer layer 17 disposed on the base layer 15 and the shielding layer 16. It should be understood that the present disclosure is not limited thereto.

Figure 6:
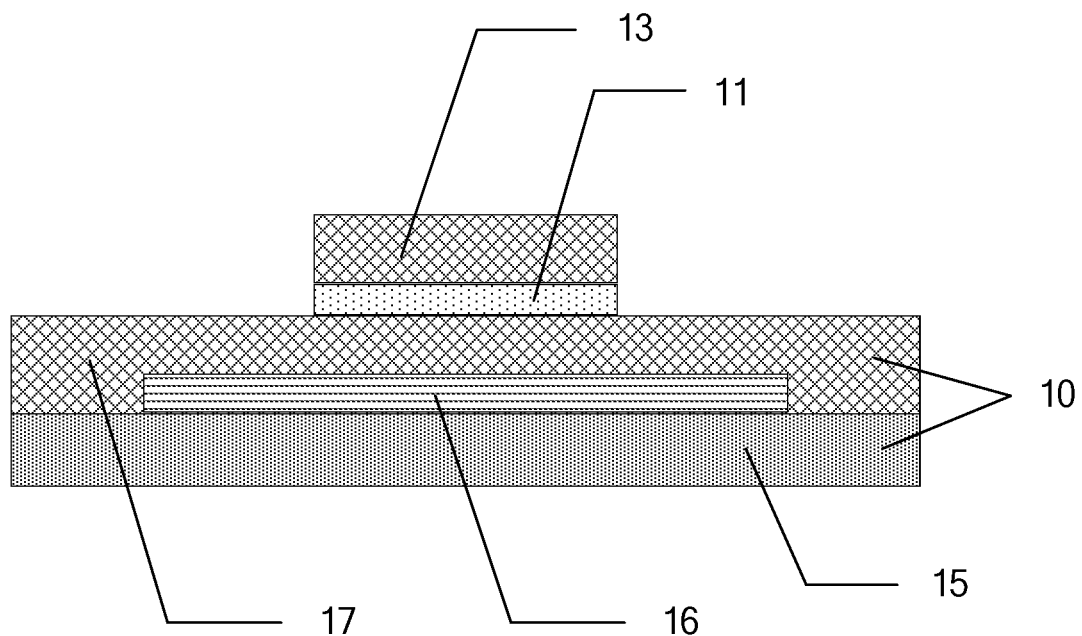
FIG. 6 illustrates a schematic cross-sectional view of a thin film transistor partly fabricated according to a method of some embodiments of the present disclosure, with an active layer and a first insulating layer formed.

Step 402: forming an active layer 11 and a first insulating layer 13, which are stacked, on the substrate 10, as shown in FIG. 6. The active layer is disposed between the substrate and the first insulating layer.

Step 403: forming a gate 14 on the first insulating layer 13, and a first source electrode and a first drain electrode 12 on the substrate 10. The first source and drain electrodes 12 are coupled to the active layer 11. The thicknesses and materials of the gate 14 and the first source and drain electrodes 14 may be substantially the same, as shown in FIG. 2. In some alternative embodiments, the main-body portion of the gate has substantially the same thickness as the main-body portions of the first source and drain electrodes.

Figure 7:
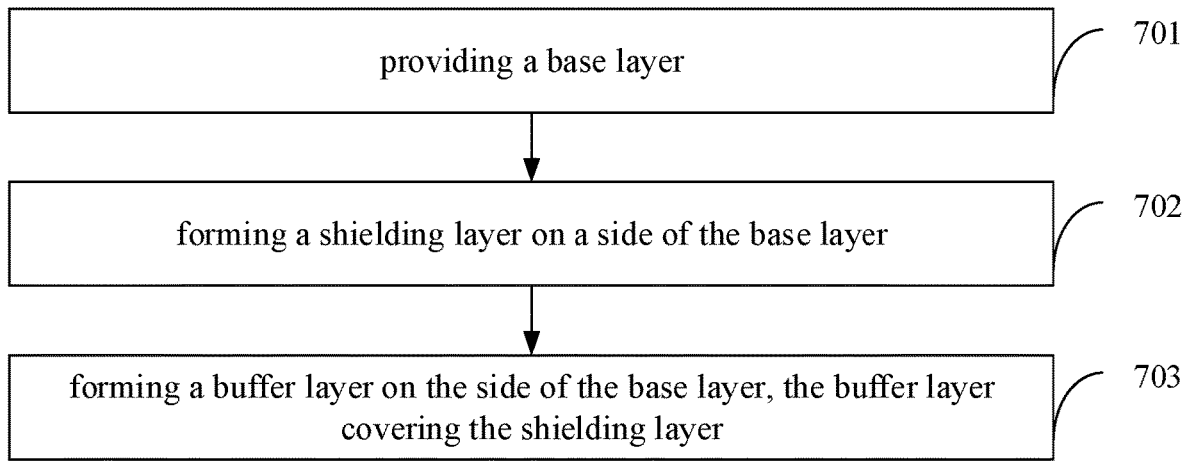
FIG. 7 is a flow chart showing steps of a method for fabricating a substrate according to some embodiments of the present disclosure.

Referring to FIG. 7, the step 401 of providing the substrate 10 may further include:

Step 701: providing a base layer 15.

Step 702: forming a shielding layer 16 on the base layer 15.

In some embodiments, a MoNb metal layer and an AlNd metal layer may be sequentially deposited (e.g., by sputtering, MOCVD, etc.) on the base layer 15; the stack of the MoNb metal layer and the AlNd metal layer is then patterned to form the shielding Layer 16. For example, a photoresist may be coated on the MoNb metal layer and the AlNd metal layer, the photoresist may be patterned by photolithography, and the stack may be etched using the patterned photoresist as a mask to form the shielding layer 16.

Step 703: forming a buffer layer 17 on the base layer 15 and the shielding layer 16 to obtain the substrate 10, as shown in FIG. 5. As shown in the drawings, the buffer layer covers the shielding layer.

In some embodiments, the buffer layer 17 is formed by depositing a buffer material layer on the base layer 15 and the shielding layer 16.

Figure 8:
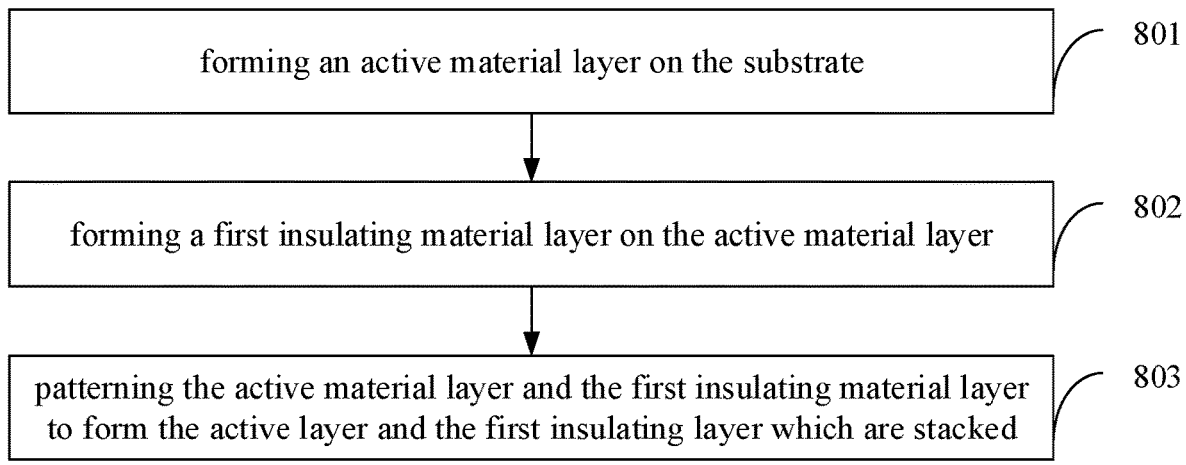
FIG. 8 is a flow chart showing the steps of fabricating an active layer and a first insulating layer in a method of fabricating a thin film transistor according to some embodiments of the present disclosure.

In an implementation of the foregoing embodiment, referring to FIG. 8, the foregoing step 402 may further include:

Step 801: forming (e.g., by depositing) an active material layer on the substrate 10.

Step 802: forming (e.g., by depositing) a first insulating material layer on the active material layer.

Step 803: performing a patterning process on the active material layer and the first insulating material layer to form the active layer 11 and the first insulating layer 13 which are stacked, as shown in FIG. 6. Here, the stacked active layer 11 and first insulating layer 13 may be formed by one patterning process in some embodiments.

In some embodiments, after the active material layer and the first insulating material layer are formed, the active layer 11 and first insulating layer 13 are formed once by using a patterned photoresist (formed by photolithography) as a mask, and dry etching and then wet etching.

Thus, since the active layer and the first insulating layer can be formed by means of one photolithography, the process can be further simplified and the cost can be reduced.

Figure 9:
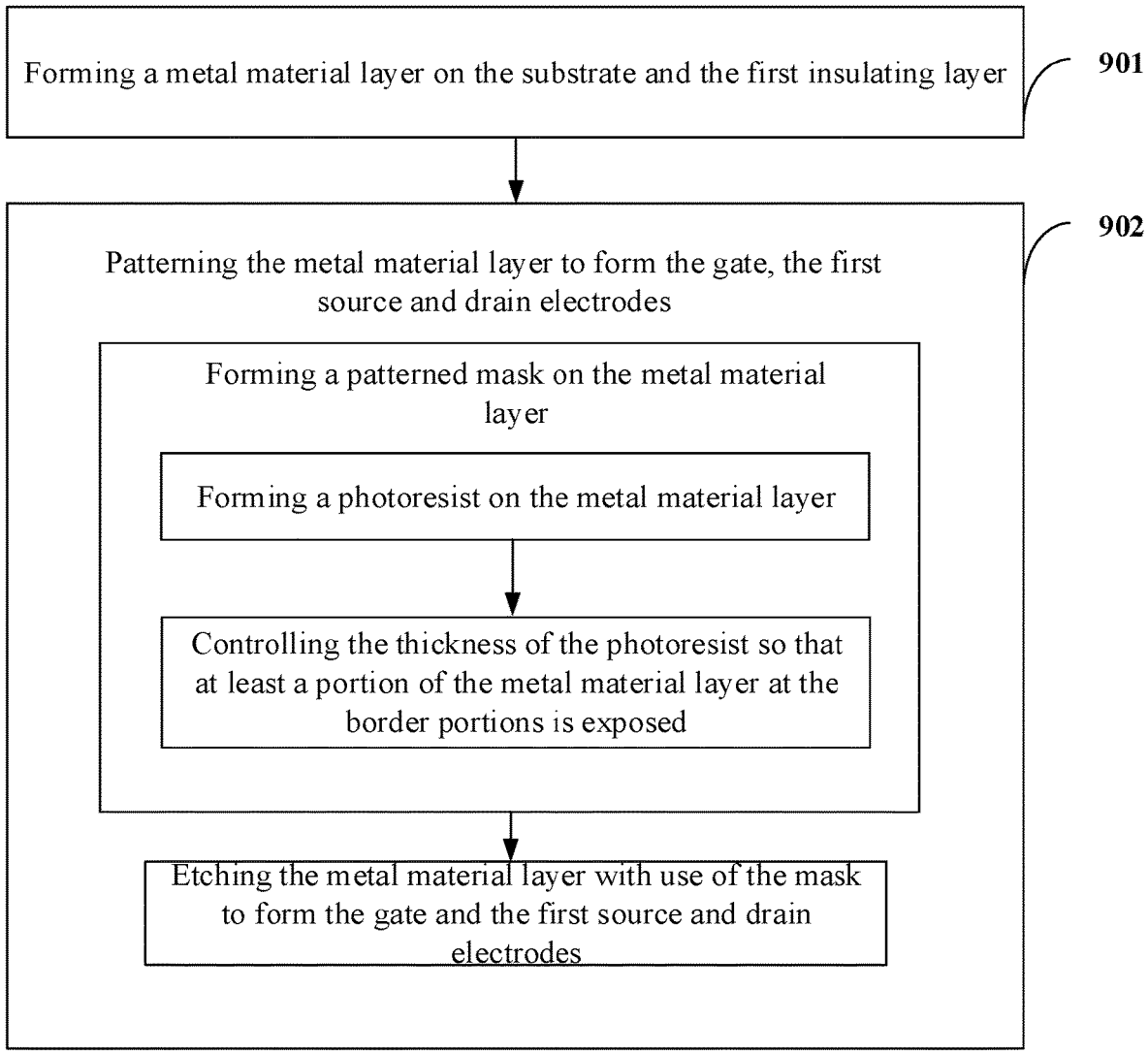
FIG. 9 is a flow chart of a method of fabricating a thin film transistor according to some embodiments of the present disclosure, which shows steps of fabricating a gate and a first source electrode and a first drain electrode.

In an implementation of the foregoing embodiments, referring to FIG. 9, the step 403 may further include:

Step 901: forming (for example, by depositing) a metal material layer on the first insulating layer 13 and the substrate 10. The metal material layer covers the stacked first insulating layer and active layer.

Step 902: performing a patterning process on the metal material layer to form a gate 14 on the first insulating layer 13, and a first source electrode and a first drain electrode 12 on the substrate 10.

In some embodiments, the gate 14 and the first source and drain electrodes 12 can be simultaneously obtained by one patterning process to form a top gate self-aligned structure. The patterning process may ensure that the first source and drain electrodes 12 are formed in good contact with the active layer 11, so as to further reduce the electric resistance.

In a specific implementation of the embodiments, the patterning process may include: forming a patterned mask on the metal material layer. For example, a photoresist is formed (e.g., coated) on the metal material layer, and the photoresist is exposed and developed to form the patterned mask.

Thereafter, the metal material layer is etched with use of the patterned mask to form the gate 14 and the first source and drain electrodes 12. Here, the first source and drain electrodes 12 are coupled to the active layer 11.

In some embodiments, the duration of the etching is set to be greater than a predetermined time length to completely separate the gate 14 from the first source and drain electrodes 12. For example, the etching may be configured to continue for a period of time to perform an over-etching after the ends of the first source and drain electrodes which are facing away from the active layer are etched. Since the thickness of the metal material at the border portions between the first source and drain electrodes and the gate (i.e., at the sides of the stack of the active layer and the first insulating layer) may be smaller or even much smaller than the thickness of the metal of the gate and the first source electrode and first drain electrode, thus appropriately extending of the etching time can ensure that the metal at the border portions is completely broken, thus avoiding short circuiting. The specific etching duration is related to the properties of the metal material and the etchant, and can be obtained in advance by experiments. There is no specific limit to the preset etching duration in the present disclosure.

In addition, in order to ensure that the gate 14 is completely separated from the first source and drain electrodes 12, the following measures can also be taken. For example, in a photolithography process to form the mask (e.g., photoresist), the thickness of the photoresist can be controlled so that the metal at the junction of a portion corresponding to the first source and drain electrodes 12 and a portion corresponding to the gate 14 of the metal material portion is exposed, and thereby completely etched away in a subsequent process. Thus, the separation of the gate 14 from the first source and drain electrodes 12 can be ensured. As another example, the thickness of the photoresist can be controlled by integrally removing a certain thickness of photoresist after forming the photoresist, so that at least a portion of the metal material layer at the border portions is exposed. In order to further ensure the metal separation at the border portions, a process such as lateral etching may also be employed.

In this way, since the first source and drain electrodes and the gate can be formed by one patterning process, the overlap between the gate and the source and drain electrodes can be effectively avoided, and the parasitic capacitance and parasitic resistance introduced by the overlap can be suppressed. This helps to reduce parasitic effects and signal delay and improves device performance. According to some embodiments of the present disclosure, the process of forming a LDD region by conductorizing process can be avoided, thus the resistance between the source and drain electrodes and the active layer can be reduced. The technologies disclosed herein can be applied to high resolution display devices.

Figure 10:
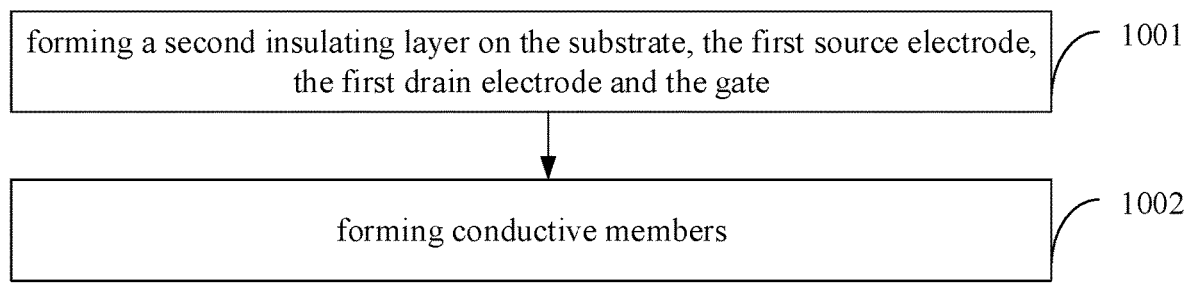
FIG. 10 is a flow chart showing steps of another method for fabricating a thin film transistor according to some embodiments of the present disclosure.

In a practical application, referring to FIG. 10, the method for fabricating the thin film transistors may further include:

Step 1001: forming a second insulating layer 18 on the substrate 10, the first source and drain electrodes 12, and the gate 14. As shown in FIG. 3, the second insulating layer 18 covers the first source and drain electrodes 12 and the gate 14.

Step 1002: forming conductive members 19 that are coupled to the first source and drain electrodes, respectively through the second insulating layer. As shown in FIG. 3, the conductive member 19 may include a portion (e.g., a wiring) on the second insulating layer 18 which is electrically coupled the first source and drain electrodes 12 through a portion (e.g., via) disposed in the second insulating layer 18.

According to some further embodiments of the present disclosure, an array substrate, including the thin film transistor of any of the embodiments, is also provided.

According to some still further embodiments of the present disclosure, a display panel including the thin film transistor of any of the embodiments is also provided. In some embodiments, the display panel can be a TFT-LCD display panel, an OLED display panel, or the like.

According to some other embodiments of the present disclosure, a display device including the array substrate of any of the embodiments is also provided. There is also provided a device comprising any of the above described thin film transistors.

According to the embodiments of the present disclosure, it does not need to provide an LDD region between the first source/drain electrode and the active layer. Therefore, the total resistance between the source and drain electrodes and the active layer no longer includes the resistance of the LDD regions themselves. Thus, the resistance between the source and drain electrodes and the active layer is effectively reduced. In addition, the side light can be effectively shielded by the first source and drain electrodes, and the illumination stability of the TFT can be improved. Combined with the shielding layer to block the front-face light, the illumination stability of the TFT can be further improved. According to some embodiments of the present disclosure, the first source and drain electrodes and the gate may be formed by one patterning process. In this way, the process of conductorizing the active layer (i.e., converting the active layer into conductor) is avoided, thus the process is simplified, and the resistance between the source and drain electrodes and the active region is reduced. The overlapping area between the gate and the source and drain electrodes is avoided, and thus the parasitic capacitance and parasitic resistance introduced by the overlapping area are suppressed, the parasitic effect and signal delay are reduced, and the device performance is improved. The technologies disclosed herein can be applied to, for example, high resolution display devices.

Further, in some embodiments, the active layer and the first insulating layer may also be formed in same step(s), which may further simplify the process and reduce the cost.

According to the fabrication process of the thin film transistor provided by the present disclosure, the number of masks is not increased, and the process can be performed in a relatively low temperature environment, and thus can be applied in the flexible display. According to the embodiments of the present disclosure, process cost can be reduced, and process controllability can be improved.

The various embodiments in the present specification are described in a progressive manner, and the description of each embodiment may mainly focus on differences from other embodiments, and the same or similar parts can be referred to among the various embodiments.

It should also be noted that in this specification, the terms such as "first" and "second" are used solely to distinguish one entity or operation from another entity or operation, and do not necessarily require or imply that there is any relationship or order in temporal or any other means between these entities or operations. Furthermore, as used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus. Unless otherwise stated, an element that is leaded by the phrase "comprising a . . . " does not exclude the presence or addition of other same elements in the process, method, item, or device that comprises the element.

The methods for fabricating a thin film transistor, the thin film transistors, array substrates, and display devices provided by the present disclosure are described in detail above. The principles and implementations of the present disclosure are described herein by using specific examples, and the descriptions of the above embodiments are used to help the understanding of the principles and ideas of the present disclosure. And, it will be readily understood for those of ordinary skills in the art various changes and modifications can be made in the specific embodiments and applications according to the teachings and ideas of the present disclosure. It should be noted that the contents of the Descriptions shall not be construed as limits to the inventions.

It will be understood that the words "front", "back", "top", "bottom", "above", "below", etc., if any, in the specification and claims, are used for descriptive purposes, and not for necessarily describing a constant relative position. It will also be understood that the terms so used are interchangeable under appropriate circumstances, such that the embodiments of the present disclosure described herein, for example, can operate in other orientations which are different from the orientation(s) illustrated or otherwise described herein.

Those skilled in the art will appreciate that the boundaries between the above operations are merely illustrative. Multiple operations may be combined into a single operation, a single operation may be distributed among additional operations, and operations may be performed at least partially overlapping in time. Moreover, alternative embodiments may include multiple instances of a particular operation, and the operational sequence may be varied in other various embodiments. However, other modifications, changes, and replacements are equally possible. Accordingly, the specification and drawings are to be regarded as descriptive, not limiting.

While the specific embodiments of the present disclosure have been described in detail by way of example, it is understood that the various embodiments disclosed herein may be combined in any combination without departing from the spirit and scope of the disclosure. It will be understood by those skilled in the art that various modifications may be made in the embodiments without departing from the scope and spirit of the disclosure. The scope of the disclosure is defined by the appended claims.

What is claimed is:

1. A thin film transistor comprising:
   a substrate;
   an active layer, a first source electrode and a first drain electrode disposed on a side of the substrate, the first source and drain electrodes being coupled to the active layer; and
   a first insulating layer and a gate disposed on a side of the active layer which is facing away from the substrate, the first insulating layer positioned between the active layer and the gate,
   wherein the gate has a substantially same material as the first source and drain electrodes, and a main-body portion of the gate has a substantially same thickness as main-body portions of the first source and drain electrodes, and
   wherein the substrate comprises:
   a base layer, a shielding layer, and a buffer layer;
   wherein the shielding layer is disposed between the base layer and the buffer layer; and
   wherein the buffer layer is closer, than the base layer, to the active layer.

2. The thin film transistor of claim 1, wherein an orthographic projection of the first insulating layer on the substrate overlaps with an orthographic projection of the active layer on the substrate in entirety.

3. The thin film transistor of claim 1, wherein an orthographic projection of the active layer on the substrate at least partially overlaps with an orthographic projection of the gate on the substrate, and the orthographic projection of the gate on the substrate does not exceed the orthographic projection of the active layer on the substrate.

4. The thin film transistor according to claim 1, wherein the active layer comprises metal oxide semiconductor material.

5. The thin film transistor of claim 1, further comprising:
   a second insulating layer disposed on the side of the substrate and covering at least the first source electrode, the first drain electrode and the gate; and
   conductive members coupled to the first source and drain electrodes respectively through the second insulating layer.

6. The thin film transistor according to claim 1, wherein the first source and drain electrodes each adjoin a respective side surface of the active layer.

7. The thin film transistor according to claim 1, wherein the gate and the first source and drain electrodes are formed from a same metal material layer.

8. A display device comprising the thin film transistor of claim 1.

9. A method of fabricating a thin film transistor, comprising:
   providing a substrate;
   forming an active layer and a first insulating layer, which are staked, on a side of the substrate, the active layer positioned between the substrate and the first insulating layer;
   forming a gate on a side of the first insulating layer which is facing away from the substrate, and a first source electrode and a first drain electrode on the side of the substrate, the first source electrode and the first drain electrode coupled to the active layer,
   wherein the gate has a substantially same material as the first source and drain electrodes, and a main-body portion of the gate has a substantially same thickness as main-body portions of the first source and drain electrodes, and
   wherein providing the substrate comprises:
   providing a base layer;
   forming a shielding layer on a side of the base layer; and
   forming a buffer layer on the side of the base layer, the buffer layer covering the shielding layer,
   wherein the buffer layer is closer, than the base layer, to the active layer.

10. The method according to claim 9, wherein forming the active layer and the first insulating layer, which are stacked, on a side of the substrate comprises:
    forming an active material layer on the side of the substrate;
    forming a first insulating material layer on a side of the active material layer which is facing away from the substrate;
    patterning the active material layer and the first insulating material layer to form the active layer and the first insulating layer which are stacked.

11. The method according to claim 9, wherein forming the gate and the first source and drain electrodes comprises:
    forming a metal material layer on the side of the substrate, the metal material layer covering the first insulating layer and the active layer which are stacked;
    patterning the metal material layer to form the gate, the first source and drain electrodes.

12. The method according to claim 11, wherein patterning the metal material layer comprises:
    forming a patterned mask on a side of the metal material layer which is facing away from the substrate; and
    etching the metal material layer with use of the patterned mask to form the gate and the first source and drain electrodes,
    wherein the etching is configured to continue for a period of time after ends of the first source and drain electrodes which are facing away from the active layer are etched, so that the gate, the first source and drain electrodes are completely separated.

13. The method according to claim 9, further comprising:
    forming a second insulating layer on the side of the substrate, the second insulating layer covering the first source electrode, the first drain electrode and the gate; and
    forming conductive members coupled to the first source and drain electrodes, respectively, through the second insulating layer.

14. The method of claim 9, wherein the first source and drain electrodes each adjoin a respective side surface of the active layer.

15. The method of claim 12, wherein the metal material layer has a thickness substantially same as the gate, and the thickness is configured such that the metal material layer covers side surfaces of the active layer and the first insulating layer.

\* \* \* \* \*